United States Patent
Richter et al.

(10) Patent No.: US 9,412,859 B2
(45) Date of Patent: Aug. 9, 2016

(54) CONTACT GEOMETRY HAVING A GATE SILICON LENGTH DECOUPLED FROM A TRANSISTOR LENGTH

(71) Applicant: GLOBALFOUNDRIES Inc., Grand Cayman (KY)

(72) Inventors: Ralf Richter, Radebeul (DE); Peter Javorka, Radeburg (DE); Jan Hoentschel, Dresden (DE); Stefan Flachowsky, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/792,730

(22) Filed: Mar. 11, 2013

(65) Prior Publication Data

US 2014/0252429 A1   Sep. 11, 2014

(51) Int. Cl.
*H01L 29/78* (2006.01)
*H01L 21/28* (2006.01)
(Continued)

(52) U.S. Cl.
CPC .......... *H01L 29/78* (2013.01); *H01L 21/28008* (2013.01); *H01L 21/28123* (2013.01); *H01L 29/42376* (2013.01); *H01L 29/66477* (2013.01);
(Continued)

(58) Field of Classification Search
CPC ............. H01L 29/772; H01L 29/665; H01L 21/02529; H01L 21/32051; H01L 21/823456; H01L 21/823468; H01L 29/1033; H01L 29/1608; H01L 29/6653; H01L 29/66719; H01L 45/1675; H01L 29/78; H01L 29/42376; H01L 29/66477; H01L 29/513; H01L 29/4966; H01L 29/517; H01L 21/28123; H01L 21/28008

USPC ................................................. 257/288, 620
See application file for complete search history.

(56) References Cited

U.S. PATENT DOCUMENTS 6,011,290 A   1/2000   Gardner et al.
6,069,032 A   5/2000   Lee
(Continued)

FOREIGN PATENT DOCUMENTS

CN   1538531 A   10/2004
TW   200531177 A   9/2005

OTHER PUBLICATIONS

"Plasma-Induced Damage in Hi-k/Metal Gate Stack Dry etch", IEEE Electronic Device Letters, vol. 27, No. 12, Dec. 2006.*
(Continued)

*Primary Examiner* — Bilkis Jahan
*Assistant Examiner* — Nga Doan
(74) *Attorney, Agent, or Firm* — Amerson Law Firm, PLLC

(57) ABSTRACT

Methods for forming a semiconductor device are provided. In one embodiment, a gate structure having a gate insulating layer and a gate electrode structure formed on the gate insulating layer is provided. The methods provide reducing a dimension of the gate electrode structure relative to the gate insulating layer along a direction extending in parallel to a direction connecting the source and drain. A semiconductor device structure having a gate structure including a gate insulating layer and a gate electrode structure formed above the gate insulating layer is provided, wherein a dimension of the gate electrode structure extending along a direction which is substantially parallel to a direction being oriented from source to drain is reduced relative to a dimension of the gate insulating layer. According to some examples, gate structures are provided having a gate silicon length which is decoupled from the channel width induced by the gate structure.

24 Claims, 7 Drawing Sheets

(51) Int. Cl.
- *H01L 29/66* (2006.01)
- *H01L 29/423* (2006.01)
- *H01L 29/49* (2006.01)
- *H01L 29/51* (2006.01)

(52) U.S. Cl.
CPC ....... *H01L 29/66575* (2013.01); *H01L 29/4966* (2013.01); *H01L 29/513* (2013.01); *H01L 29/517* (2013.01); *H01L 29/665* (2013.01); *H01L 29/6653* (2013.01)

(56) References Cited

U.S. PATENT DOCUMENTS

| | | | |
|---|---|---|---|
| 6,306,715 B1 | 10/2001 | Chan et al. | |
| 6,335,233 B1 | 1/2002 | Cho et al. | |
| 6,399,469 B1 * | 6/2002 | Yu | H01L 21/2807 257/E21.201 |
| 6,515,320 B1 * | 2/2003 | Azuma et al. | 257/288 |
| 6,858,907 B2 * | 2/2005 | Ryu | H01L 21/28114 257/410 |
| 6,927,110 B2 | 8/2005 | Kanemoto | |
| 7,118,954 B1 | 10/2006 | Lin et al. | |
| 7,129,140 B2 | 10/2006 | Chen et al. | |
| 2004/0206980 A1 | 10/2004 | Cheong et al. | |
| 2006/0006478 A1 | 1/2006 | Kanegae et al. | |
| 2009/0098737 A1 * | 4/2009 | Doris et al. | 438/742 |
| 2009/0212332 A1 * | 8/2009 | Wang et al. | 257/288 |
| 2010/0181620 A1 * | 7/2010 | Booth et al. | 257/350 |
| 2012/0086056 A1 * | 4/2012 | Beyer et al. | 257/288 |
| 2012/0126295 A1 * | 5/2012 | Edge et al. | 257/288 |
| 2013/0277719 A1 * | 10/2013 | Kao et al. | 257/288 |

OTHER PUBLICATIONS

"1-um MOS Process Using Anisotropic Dry Etching", IEEE Transaction on Electron Devices, vol. ED-27, No. 8, Aug. 1980.*

Translation of Official Action from Taiwanese Patent Application No. 103103476 dated Jun. 26, 2015.

Translation of Official from German Patent Application No. 10 2014 203 796.4 dated Aug. 29, 2015.

Translation of Official Action from Chinese Patent Application No. 2014100867562 dated Apr. 11, 2016.

* cited by examiner

CONTACT GEOMETRY HAVING A GATE SILICON LENGTH DECOUPLED FROM A TRANSISTOR LENGTH

BACKGROUND OF THE INVENTION

1. Field of the Invention

In general, the present disclosure is directed to contact geometries in semiconductor devices of integrated circuits. The present disclosure relates to device structures with a gate silicon length that is decoupled from a transistor length and, in particular, when maintaining the transistor length.

2. Description of the Related Art

The majority of present-day integrated circuits (ICs) are implemented by using a plurality of interconnected field effect transistors (FETS), also called metal oxide semiconductor field effect transistors (MOSFETS), or simply MOS transistors. Typically, present-day integrated circuits are implemented by millions of MOS transistors which are formed on a chip having a given surface area.

In MOS transistors, a current flow through a channel formed between the source and drain of a MOS transistor is controlled via a gate which is typically disposed over the channel region, independent from whether a PMOS transistor or an NMOS transistor is considered. For controlling a MOS transistor, a voltage is applied to the gate of the transistor and current flows through the channel when the applied voltage is greater than a threshold voltage which nontrivially depends on properties of a transistor such as size, material, etc.

In efforts to build integrated circuits with a greater number of transistors and faster semiconductor devices, the trend towards ultra large scale integration (ULSI) in semiconductor technology has resulted in ICs which are ever-decreasing in size and, therefore, reducing the size of MOS transistors. In present-day semiconductor technology, the minimum feature sizes of microelectronic devices have been approaching the deep submicron regime so as to meet the demand for faster and lower power microprocessors and digital circuits and, in general, semiconductor device structures which have a higher energy efficiency. A critical dimension (CD) is generally represented by a width or length dimension of a line or space that has been identified as critical to the device under fabrication to operate properly and, furthermore, determines the device performance.

As a result, the continued increase in performance of ICs has led IC designers to push CDs to smaller scales which allow increasing the integration density of IC structures. It is easy to see that the integration density depends on the dimensions of the MOS transistors representing the core building elements of ICs. An important parameter to characterize the transistor size is represented by the contacted poly pitch (CPP), which represents a measure for a distance between a source contact and a drain contact or measures a pitch between the source and drain of a transistor. In current semiconductor technologies, the CPP has been reduced down to about 80 nm. Downscaling of the CPP was accompanied by a scaling of the CDs of gate electrodes and, in particular, of length dimensions of gate electrodes. The gate length at a technology node may be roughly estimated to be on the order of a quarter of the CPP. For instance, a CPP of 192 nm has a gate CD of roughly 49 nm, a CPP of 130 nm has a gate CD of roughly 32 nm, and a CPP of 113 nm has a gate CD of roughly 28 nm.

FIG. 1 shows a conventional semiconductor device structure during a middle-end-of-line (MEOL) fabrication process flow in which source contact structures, drain contact structures and gate electrode contact structures are formed.

FIG. 1 shows a semiconductor substrate 100 and two gate electrode structures 120 and 140 disposed on a surface of the semiconductor substrate 100. As schematically depicted in FIG. 1, source and drain regions 112, 114 and 116 are formed within the semiconductor substrate 100 adjacent to the respective gate electrode structure 120 and 140 without explicitly illustrating source and drain extensions and halo regions. The gate electrode structure 120 comprises a gate insulating layer 124, a gate electrode layer 126 and a gate silicide 164 formed above the gate electrode layer 126. A spacer structure 128 is formed at each side of the gate electrode structure 120. Accordingly, the gate electrode structure 140 comprises a gate insulating layer 144, a gate electrode layer 146 and a gate silicide 168 formed on the gate electrode layer 146. Sidewall spacers 148 are formed at each side of the gate electrode structure 140.

A length dimension of the gate electrode structure 120 is schematically represented by an arrow 122 and substantially defines the length of a channel region extending between the source and drain regions 114 and 116. Accordingly, the gate electrode structure 140 has a length dimension which is schematically represented by an arrow 142 and substantially defines the length of a channel region extending between the source and drain regions 112 and 114. A contact 160 schematically represents a contact for contacting the source and drain of a transistor structure comprising one of the gate electrode structures 120, 140. The contact is disposed on the source or drain region 114. According to the illustration in FIG. 1, a CPP is schematically depicted as a pitch between the source and drain regions 114 and 116.

At a technology node, the CPP rather represents a given quantity than a variable and, therefore, the CPP together with the channel length 122 defines the space for the contact 160 to land between two neighboring gate electrode structures 120 and 140 as may be understood from the illustration in FIG. 1. A contact geometry, such as represented in FIG. 1, may be further parameterized by two parameters, "a" and "b" as schematically depicted in FIG. 1. Herein, the parameter "b" characterizes the distance between the contact 160 and the gate electrode stack 124, 126 of the gate electrode structure 120, and the parameter "a" characterizes the distance between the contact 160 and the gate silicide 164.

With FIG. 1 at hand, the person skilled in the art will understand that a scaling of the CPP down to smaller dimensions will, first of all, result in contact geometries having smaller parameters "a" and "b". When aiming at smaller technology nodes, several issues arise with regard to the contact geometry and which become more and more important at smaller scales.

When decreasing the channel length of a transistor, a coupling between source/drain and the channel becomes stronger, such that the threshold voltage is effectively lower for transistors with shorter gate lengths, generally being referred to as Vth roll-off. For a given CPP, the gate width (e.g., reference numeral 122 in FIG. 1) is, therefore, required to be as big as possible, leading to the requirement of the parameter "a" to become smaller. In turn, the critical dimension CD of a contact (e.g., reference numeral 160 in FIG. 1) is required to be as big as possible in order to define sufficient space for the contact (e.g., reference numeral 160 in FIG. 1) to land between two neighboring gate electrode structures (e.g., reference numerals 120 and 140 in FIG. 1). However, in any case, the parameter "a" is expected to be smaller than the parameter "b" and, in particular, the parameter "a" is critical with regard to CA-PC leakage which depends on the distance between the gate silicide (e.g., reference numeral 164 in FIG. 1) formed on a gate electrode layer (e.g., reference numeral 126 in FIG. 1) and the contact (e.g., reference numeral 160 in FIG. 1) and the contact taper angle of the contact (e.g., reference numeral 160 in FIG. 1). When increasing the parameter "a" by decreasing the CD of a contact (e.g., reference numeral 160 in FIG. 1) for a fixed gate length, the contact resistance of the contact (e.g., reference numeral 160 in FIG. 1) is increased and, therefore, transistor structures having a high contact resistance are obtained. In consequence, present-day semiconductor devices at small technology nodes increasingly suffer from increased yield loss and low device performance with a high device variability and fluctuations in device characteristics.

It is, therefore, desirable to provide contact geometries with smaller CPP and smaller parameter "a" without detrimentally affecting the performance of scaled transistors. It is further desirable to provide contact geometries which maintain a sufficiently big parameter "a" at a given technology node.

In view of the above discussion, there exists a need for methods for forming a semiconductor device and for a semiconductor device structure providing a low yield loss and a lower contact resistance, while maintaining a high device performance or even increasing the device performance with smaller device variability and fluctuations in the device characteristics.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to some aspects of the present disclosure, methods for forming a semiconductor device are provided. In some illustrative embodiments, a gate structure is formed, the gate structure comprising a gate insulating layer and a gate electrode structure formed on the gate insulating layer. Methods in accordance with some illustrative embodiments further comprise reducing a dimension of the gate electrode structure relative to the gate insulating layer along a direction extending in parallel to a direction connecting source and drain.

According to other aspects of the present disclosure, a semiconductor device structure having a gate structure is provided. According to some illustrative embodiments, the gate structure comprises a gate insulating layer and a gate electrode structure formed above the gate insulating layer, wherein a dimension of the gate electrode structure extending along a direction which is substantially parallel to a direction being oriented from source to drain is reduced relative to a dimension of the gate insulating layer along the direction. In some illustrative examples, trimmed gate structures may be provided having a gate silicon length which is decoupled from the channel width induced by the gate structure.

According to an illustrative embodiment of the present disclosure, a method for forming a semiconductor device is provided, the method including providing an active region in a semiconductor substrate, forming a gate structure in the active region, the gate structure comprising a gate insulating layer and a gate electrode structure having a gate metal layer, applying a trimming process to the gate electrode structure for removing material having a first sidewall thickness from the gate electrode structure and forming a spacer structure on the trimmed gate structure, the spacer structure having a second sidewall thickness that is not less than the first sidewall thickness.

According to another illustrative embodiment of the present disclosure, a method for forming a semiconductor device is provided, the method including forming a gate structure in an active region of a semiconductor substrate, the gate structure comprising a high-k gate insulating layer, a gate metal layer and a polysilicon material. Furthermore, the method includes exposing an upper surface portion of at least one of the high-k gate insulating layer and the gate metal layer, and forming a spacer structure on the gate structure such that the exposed upper surface portion is covered.

According to still another illustrative embodiment of the present disclosure, a method for forming a semiconductor device is provided, the method including patterning a gate electrode stack in an active region of a semiconducting device, the gate electrode stack comprising a gate insulating layer and a gate metal layer disposed on the gate insulating layer, etching back the gate electrode stack such that dimensions of at least one of the gate insulating layer and the gate metal layer in the gate electrode stack are maintained, and forming a spacer structure in contact with the gate electrode stack.

According to yet another illustrative embodiment of the present disclosure, a method for forming a semiconductor device is provided, the method including patterning a gate structure in an active region of a semiconductor substrate, the gate structure comprising a gate insulating layer, a spacer structure and a gate electrode structure. The method further includes trimming an upper part of the gate structure so as to increase an exposed surface of the gate electrode structure by trimming the spacer structure, and performing a silicidation process after trimming the gate structure.

According to still another illustrative embodiment of the present disclosure, a semiconductor device structure is provided, the semiconductor device structure comprising a semiconductor substrate with an active region, a trimmed gate structure and source/drain regions formed in the active region adjacent to the trimmed gate structure, the trimmed gate structure comprising a gate insulating layer and a gate electrode material. Herein, a first direction is oriented in parallel to a channel length, the channel extending between the source and drain. The trimmed gate structure is configured such that a length of the gate insulating layer extending along the first direction is greater than a length of the gate electrode material extending along the first direction.

BRIEF DESCRIPTION OF THE DRAWINGS

The disclosure may be understood by reference to the following description taken in conjunction with the accompanying drawings, in which like reference numerals identify like elements, and in which.

Figure 1:
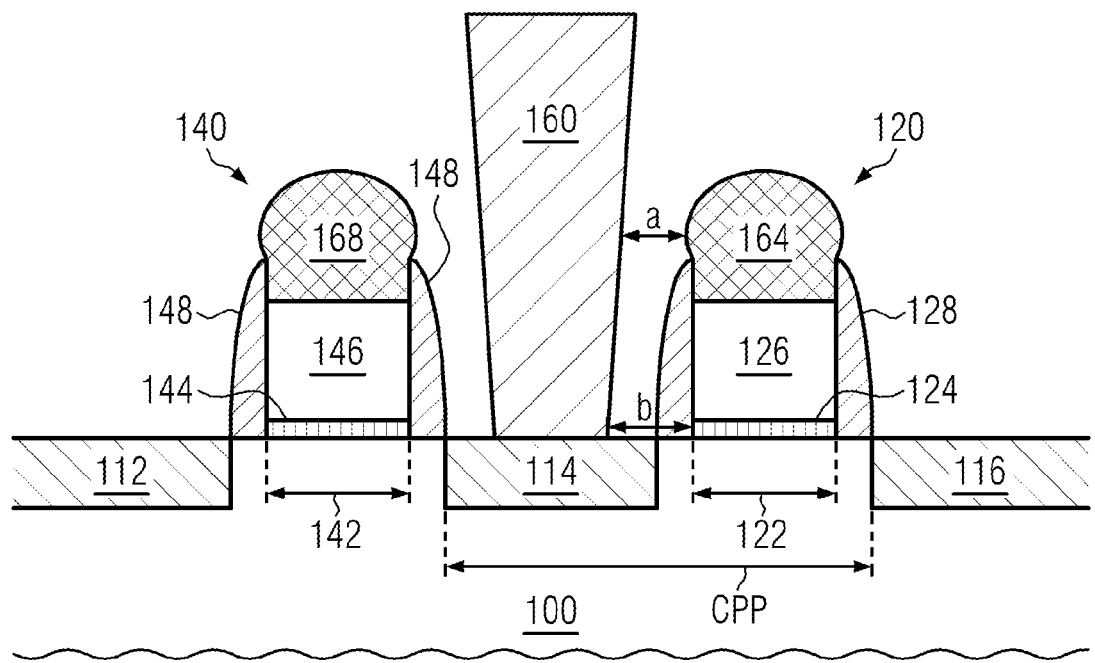
FIG. 1 schematically illustrates, in a cross-sectional view, a conventional semiconductor device structure during a typical MEOL process flow.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure and that system, structure, process or mechanical changes may be made without departing from the scope of the present disclosure. In the following description, numerous specific details are given to provide a thorough understanding of the disclosure. However, it will be apparent that the various illustrated aspects and embodiments of the disclosure may be practiced without these specific details. In order to avoid obscuring the present disclosure, some well-known circuits, system configurations, structure configurations and process steps are not disclosed in full detail.

The drawings showing embodiments of the present disclosure are semi-diagrammatic and are not to scale and, particularly, some of the dimensions are for clarity of presentation only and, therefore, are exaggeratedly shown in the drawings. Similarly, although the views in the drawings generally show similar orientations for ease of description, this depiction in the drawings is arbitrary for the most part. Generally, the embodiments of the disclosure can be operated in any orientation.

The multiple embodiments are disclosed and described having some features in common, for clarity and ease of illustration, description and comprehension thereof, similar and like features are ordinarily described with similar reference numerals as a matter of descriptive convenience. Various different embodiments are described with regard to one or more common figures as a matter of descriptive convenience. It is to be understood that this is not intended to have any other significance or provides any limitation for the present disclosure. Any numeration of embodiments, may it be explicit as $1^{st}$ embodiment, $2^{nd}$ embodiment, etc. or implied, is a matter of descriptive convenience and is not intended to provide any other significance or limitation for the present disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. The person skilled in the art understands that stress and strain may be described with regard to a tensile modulus. A circuit designer may mix and match device types, using PMOS and NMOS transistors, stressed and unstressed, to take advantage of the best characteristics of each device type as they best suit the circuit being designed.

Since a contacted poly pitch (CPP) is defined for a technology node and, thus, does not represent a variable parameter, there exists a trade-off between a length of a gate electrode and a critical dimension (CD) of a source/drain contact, as both of the gate electrode width and the contact CD need to be as big as possible. Herein, the length of a gate electrode is considered to extend along a direction parallel to a direction extending in between the source and drain and, in particular, along a direction which is substantially parallel to a direction along which a channel between the source and drain is provided. The present disclosure relates in some aspects to a concept that allows increasing the contact CD and, in particular, the space for a contact to land between two neighboring gates.

According to some illustrative embodiments, the present disclosure proposes to reduce a length dimension of a gate electrode material disposed over a gate insulating layer while maintaining a respective dimension of the gate insulating layer. According to other illustrative embodiments, the present disclosure provides trimming a silicon part of a gate structure such that a top portion of a gate silicon layer is trimmed. Herein, the space for contacts to land between two adjacent gate electrode structures may be increased.

In describing the following figures, semiconductor device structures and methods for forming a semiconductor device in accordance with various exemplary embodiments of the present disclosure will be illustrated. The described process steps, procedures and materials are to be considered only as exemplary embodiments designed to illustrate to one of ordinary skill in the art methods for practicing the invention. However, it is to be understood that the invention is not to be limited to these exemplary embodiments. Illustrated portions of semiconductor devices and semiconductor device structures may include only a single MOS structure, although those skilled in the art will recognize that actual implementations of integrated circuits may include a large number of such structures. Various steps in the manufacture of semiconductor devices and semiconductor device structures are well known and so, in the interest of brevity, many conventional steps will only be mentioned briefly herein, or will be omitted entirely without providing the well-known process details.

Figure 2:
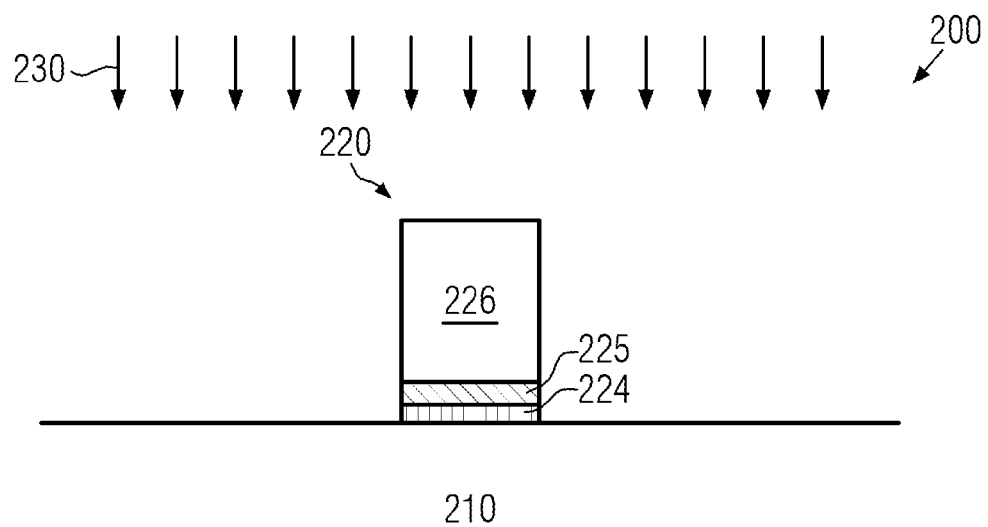
FIGS. 2-5 schematically illustrate, in cross-sectional views, some illustrative embodiments of the present disclosure.

FIG. 2 illustrates a semiconductor device structure 200 during a process for fabricating a semiconductor device. The semiconductor device structure 200 comprises a semiconductor substrate 210 and a gate structure 220 formed above a surface of the semiconductor substrate 210. The semiconductor substrate may be silicon, silicon admixed with germanium, or silicon admixed with other elements, as is common in the semiconductor industry, and for convenience will hereinafter be referred to simply as either a semiconductor or silicon substrate. The substrate may be a bulk silicon wafer or a silicon-on-insulator (SOI) structure. In an SOI structure, the semiconductor substrate 210 is a thin layer of monocrystalline semiconductor material supported by an insulating layer which, in turn, is supported by a supporting substrate.

The gate structure 220 may comprise a high-k layer 224, a gate metal layer 225 and a gate electrode layer 226. The high-k layer 224 may, for example, contain $HfO_2$, $HfSiO_2$, $ZrO_2$, or $ZrSiO_2$, or a combination of two or more thereof. The person skilled in the art appreciates that the high-k layer 224 may represent a layer of material having a dielectric constant greater than 4. The gate metal layer 225 may comprise, for example, a metal, such as Ru, a metal alloy, such as TiNi, a metal nitride, such as TaN, TaSiN, TiN, HfN, or a metal oxide, such as $RuO_2$, or any combination thereof. The gate electrode layer 226 may be a silicon-containing layer, for example comprising amorphous silicon, polysilicon or silicon/germanium, or any combination thereof. The person skilled in the art will appreciate that, instead of layers 224 and 225, a dielectric layer may be alternatively provided, and that layer 226 may comprise a metal material. It is also possible that an additional liner may be disposed under the gate electrode layer 226 embedded in or formed above the surface of the semiconductor substrate 210, the additional liner layer comprising a strain-inducing material for improving the mobility of charge carriers in a channel region of the semiconductor substrate 210 under the gate structure 220.

A trimming process 230 may be applied to the gate structure 220 as shown in FIG. 2. According to some illustrative embodiments, the trimming process 230 may be performed as an additional process directly after patterning the gate structure 220, as illustrated in FIG. 2. Alternatively, the trimming process 230 may be performed after patterning the gate electrode layer 226 and before patterning the gate insulating layer 224.

According to some exemplary embodiments, the trimming process 230 may comprise an isotropic silicon etch process with high selectivity of silicon to at least one of the high-k and the metal gate material.

According to other illustrative embodiments, the trimming process 230 may be alternatively such that, in case of a polysilicon gate electrode layer 226, a $SiO_2$ reaction layer may be formed on a timescale that is practical for manufacturing semiconductor devices, the time scale depending on the plasma processing conditions and the substrate temperature, for example. According to an illustrative example herein, a reactant gas containing excited oxygen species may be used to react with polysilicon material to form an $SiO_2$ reaction layer. The excited oxygen species may be produced using an $O_2$ plasma source. The $O_2$ plasma source may be a remote plasma source if the source needs to be removed from the substrate in the processing system. The person skilled in the art will appreciate that an oxygen-containing gas such as $O_2$ or $H_2O$ may be used to thermally oxidize the polysilicon material to form an $SiO_2$ reaction layer. Alternatively, a wet oxidation process may be used instead. Herein, the substrate may be immersed in warm $H_2O$ or in an acidic solution. The person skilled in the art will appreciate that optionally, subsequent to forming the $SiO_2$ reaction layer, a SiN layer may be deposited on the surface of the semiconductor substrate 210. Next, the $SiO_2$ reaction layer may be removed or stripped from the unreacted gate electrode layer 226. According to some illustrative examples herein, an etch gas may be applied which is selected from, for example, aqueous HF vapor or $NH_3$, followed by a heat treatment to evaporate the trimmed product.

The person with ordinary skills will appreciate that, in exemplary embodiments, illustrative trimming processes may be based on many aspects, such as ion gas species, etch biases, etch chamber and its control by voltages, over/underetches and wet etches. The person skilled in the art will take various aspects into consideration when performing illustrative embodiments of the present disclosure.

Figure 3:
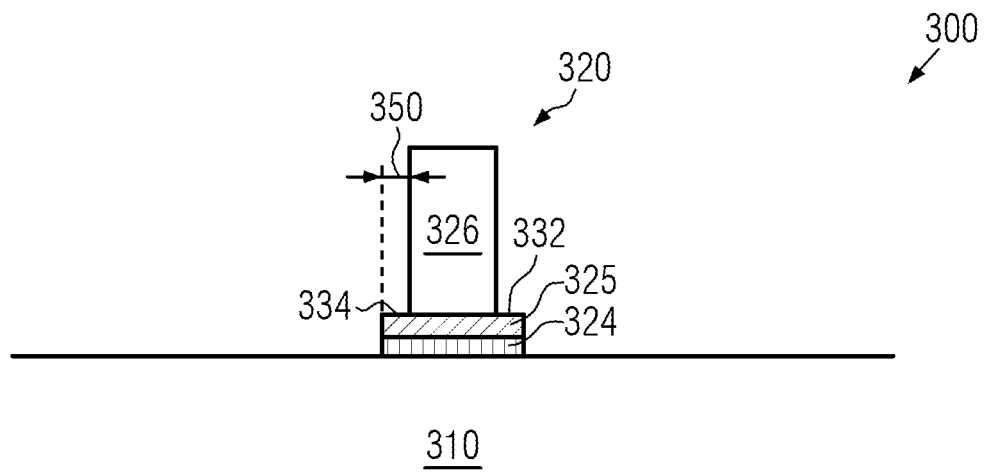

FIG. 3 shows a semiconductor device structure 300 having a trimmed gate structure 320 disposed on a surface of a semiconductor substrate 310. The semiconductor device structure 300 may be, for example, obtained after having performed the trimming process 230 to the semiconductor device structure 200 as described with regard to the exemplary embodiment illustrated in FIG. 2. The trimmed gate structure 320 comprises a gate insulating layer 324 and a gate metal layer 325 disposed on the gate insulating layer 324. Over the gate insulating layer 324 and the gate metal layer 325, a gate electrode layer 326 is formed. The gate electrode layer 326 of the trimmed gate structure 320 overlies the gate metal layer 325 such that exposed surfaces 332 and 334 of the gate metal layer 325 are not covered by the gate electrode layer 326. A person skilled in the art will appreciate that the exposed surfaces 332 and 334 define protruding portions of the gate metal layer 325 and the gate insulating layer 324 projecting away from the trimmed gate structure 320 by a distance denoted with reference numeral 350.

Figure 4:
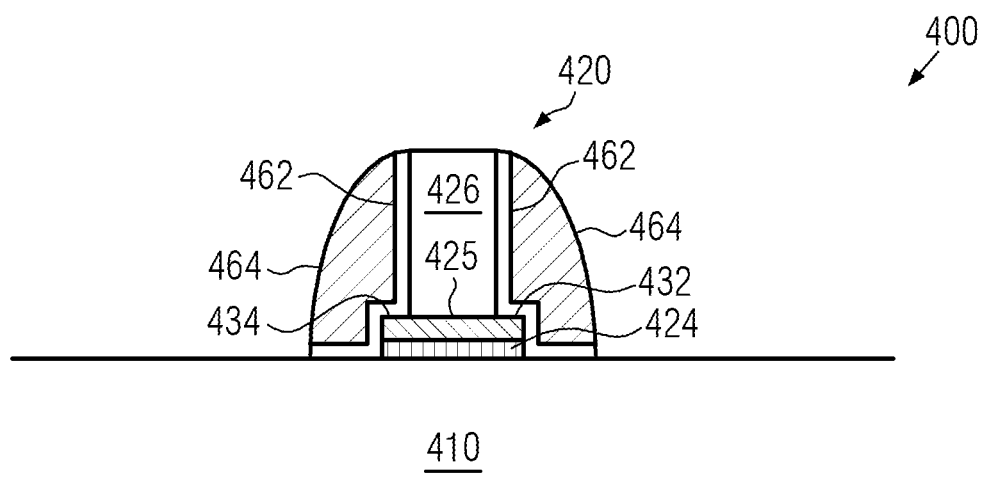

FIG. 4 shows a semiconductor device structure 400 and a semiconductor substrate 410 according to an illustrative embodiment of the present disclosure. The semiconductor device structure 400 comprises a gate structure 420 adjacent to which sidewall spacers 462 and 464 are formed. The gate structure 420 comprises a gate insulating layer 424, a gate metal layer 425 disposed on the gate insulating layer 424, and a trimmed gate electrode layer 426. The person skilled in the art will appreciate that although FIG. 4 explicitly illustrates an exemplary embodiment having two sidewall spacers 462 and 464 formed adjacent to the trimmed gate structure 420 at each side of the gate structure 420, only one sidewall spacer or, alternatively, more than two sidewall spacers may be provided. The illustrative embodiment as depicted in FIG. 4 shows a liner spacer 462 being formed adjacent to the gate electrode layer 426 and the layer stack of the gate insulating layer 424 and the gate metal layer 425 so as to cover surfaces 434 and 432 of the gate metal layer 425 that are not covered by a gate electrode material layer 426 which is disposed on the gate metal layer 425. According to the illustrative embodiment as depicted in FIG. 4, the liner spacer 462 may substantially assume a deformed "W" shape. According to some illustrative examples herein, a thickness of spacer 462 may be in a range of about 1-10 nm or in a range of about 2-5 nm.

According to an illustrative embodiment of an exemplary process flow, the semiconductor device structure 400 may be obtained subsequent to forming a trimmed gate structure, such as the trimmed gate structure 320 of FIG. 3, and forming one or more sidewall spacers adjacent to the trimmed gate structure. The person skilled in the art will appreciate that forming one or more sidewall spacers may comprise a process for forming one or more spacers by, for example, depositing spacer-forming material to form one or more layers of spacer-forming material with a thickness substantially corresponding to the distance 350 in FIG. 3. Therefore, one or more layers of spacer-forming material may be formed to replace material of the gate electrode layer which was removed when performing the trimming process as illustrated with regard to FIGS. 2 and 3. The person skilled in the art will appreciate that, alternatively, a thickness of a deposited layer of spacer-forming material may be greater than the distance 350 as illustrated in FIG. 3.

Figure 5:
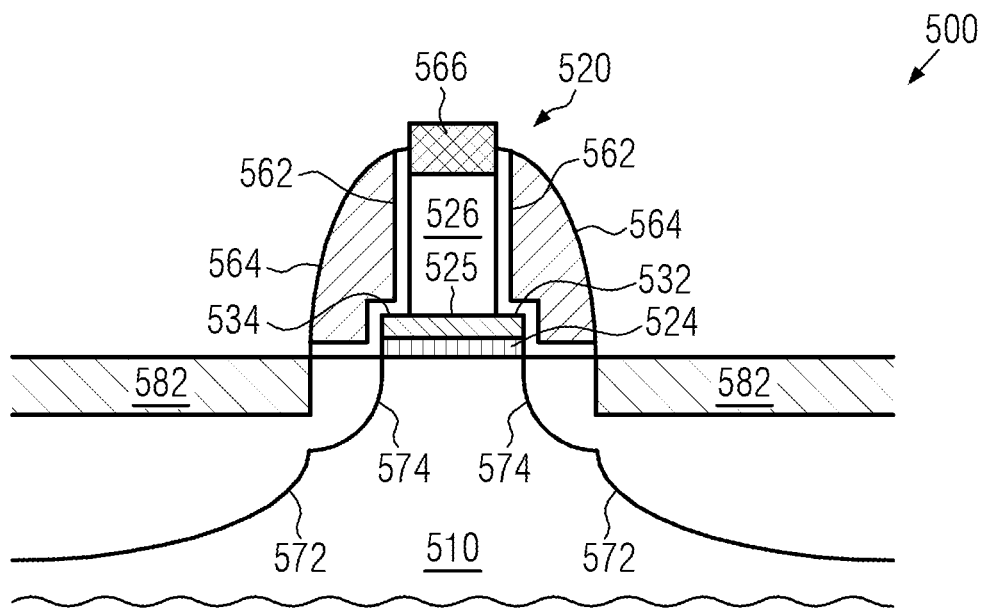

FIG. 5 shows schematically a sectional view of a semiconductor device structure 500 and a semiconductor substrate 510. A gate structure 520 is formed on a surface of the semiconductor substrate 510, the gate structure 520 comprising a gate insulating layer 524, a gate metal layer 525 and a trimmed gate electrode layer 526. A gate silicide region 566 is formed in an upper portion of the trimmed gate electrode layer 526. The trimmed gate electrode layer 526 is trimmed relative to the gate metal layer 525 and the gate insulating layer 524 such that surfaces 532 and 534 of the gate metal layer 525 are not covered by the trimmed gate electrode layer 526. The surfaces 532 and 534 of the gate metal layer 525 define protruding portions of the gate insulating layer 524 and the gate metal layer 525 projecting away from the trimmed gate electrode layer 526.

Spacers 562 and 564 are formed overlying the exposed surfaces 532 and 534 of the gate metal layer 525. The person skilled in the art will appreciate that one or more spacers may be formed adjacent to the gate electrode layer 526 and the gate metal layer 525 and the gate insulating layer 524 so as to cover sidewalls of the trimmed gate electrode layer 526, the gate metal layer 525 and the gate insulating layer 524. According to an illustrative embodiment, only one spacer (not illustrated) may be formed adjacent to the gate electrode layer 526, the spacer having a thickness such that the protruding region of the gate metal layer 525 and the gate insulating layer 524 is encapsulated by the spacer. According to the illustrative embodiment as depicted in FIG. 5, two spacers 562 and 564 are shown, the spacers 562 and 564 being formed adjacent to the gate structure 520. In an illustrative example herein, the thickness of the spacer 562 may be less than a distance measuring a length of either one of the surfaces 532 and 534 along a direction projecting away from the trimmed gate electrode layer 526. According to alternative illustrative examples herein, a thickness of the spacer 562 may be bigger than the length of the surfaces 532 and 534 along a direction projecting away from the trimmed gate electrode layer 526. The person skilled in the art will appreciate that the surfaces 532 and 534 may be covered by at least one spacer.

The semiconductor device structure 500 as depicted in FIG. 5 further comprises deep source and drain regions 572 and source/drain extension regions 574. Furthermore, silicide regions 582 are formed in alignment with the spacer 564 in the source/drain represented by reference numerals 572 and 574 in FIG. 5.

The semiconductor device structure 500 as depicted in FIG. 5 may be obtained subsequently to forming the semiconductor device structure 400 as shown in FIG. 4 by performing source/drain extension implant processes, source and drain implantation processes and forming silicide regions 582 in source/drain 572, 574 adjacent to the gate structure 520. The person skilled in the art will appreciate that the silicide regions 582 may be provided in alignment with the gate structure 520 and the sidewall spacers 562 and 564 so as to not depend on the trimmed gate electrode layer 526.

The person skilled in the art will appreciate that, due to some illustrative embodiments, the sidewall spacers may be removed earlier in the process flow and replaced by another sidewall spacer structure such that sidewall spacers 462 and 464 as depicted in FIG. 4 may actually represent a dummy spacer structure which is to be removed during an intermediate processing taking place in the process flow in between the phases illustrated with regard to FIGS. 4 and 5.

Figure 6:
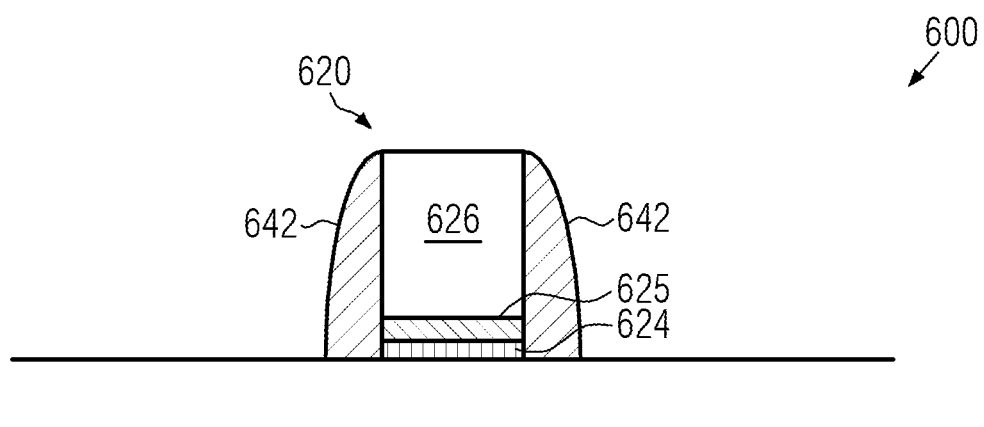
FIGS. 6-10 schematically illustrate, in cross-sectional views, other illustrative embodiments of the present disclosure.

FIG. 6 shows a semiconductor device structure 600 according to embodiments illustrating alternative process flows. The semiconductor device structure 600 is formed in a semiconductor substrate 610 such that a gate structure 620 is disposed on a surface of the semiconductor substrate 610. The gate structure comprises a gate insulating layer 624, a gate metal layer 625 and a gate electrode layer 626. Sidewall spacers 642 are formed adjacent to the gate structure 620. The sidewall spacers 642 may be comprised of one or more sidewall spacer layers as described earlier with regard to other illustrative embodiments.

According to an illustrative example, the semiconductor device structure 600 may be formed subsequently to providing the semiconductor device structure 200 as illustrated in FIG. 2. At this phase in the process flow, a process for forming the sidewall spacers 642 may be performed before performing the trimming process.

Figure 7:
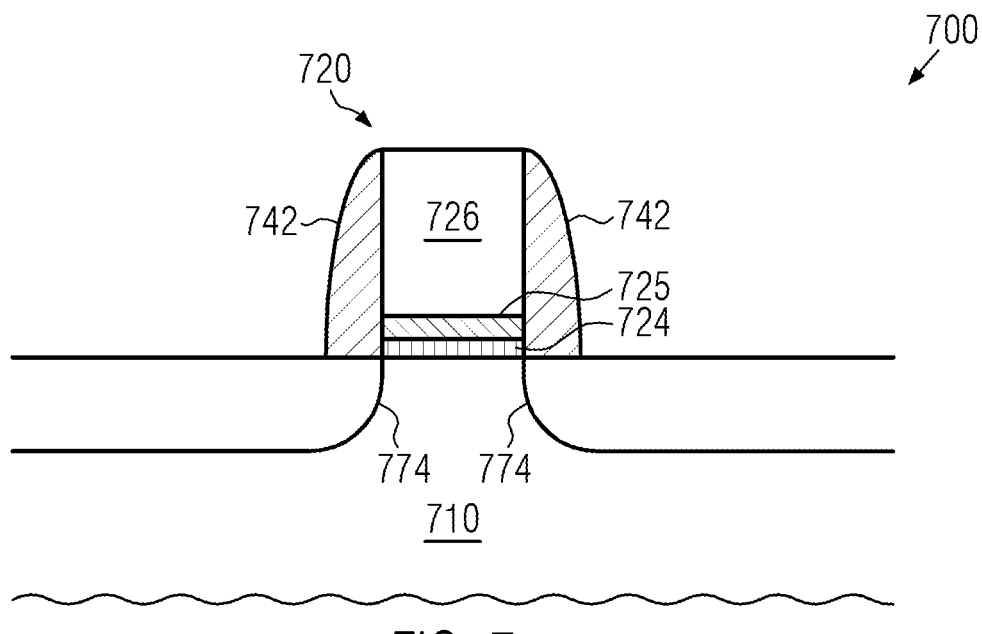

FIG. 7 shows a semiconductor device structure 700 and a semiconductor substrate 710 according to an illustrative embodiment. The semiconductor device structure 700 comprises a gate structure 720 disposed on a surface of the semiconductor substrate 710. The semiconductor device structure 700 further comprises source and drain extension regions 774 formed within the semiconductor substrate 710 in alignment with the gate structure 720 and/or the spacer structure 742. Alternatively or additionally, halo regions (not illustrated) may be formed within the semiconductor substrate 710.

According to an illustrative example, the semiconductor device structure 700 may be obtained by performing an implantation process after providing the semiconductor device structure 600 as shown in FIG. 6. By means of the implantation process (not illustrated), at least one of a source/drain extension region implantation process and a halo region implantation process may be performed. The person skilled in the art will appreciate that at least one or more sidewall spacers may act as an implantation mask for aligning the source and drain extension regions 774 and/or halo regions (not illustrated) with regard to the gate structure 720. Alternatively, implantation processes may be performed after having removed the sidewall spacer structure of the semiconductor device structure 600 as shown in FIG. 6.

Figure 8:
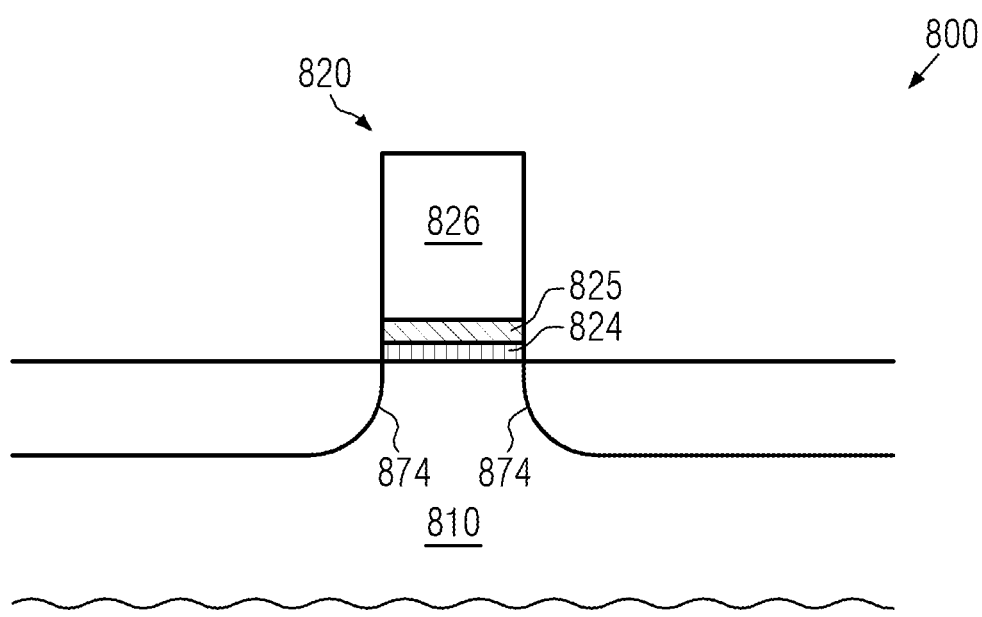

FIG. 8 depicts a semiconductor device structure 800 and a semiconductor substrate 810 according to an illustrative embodiment of the present disclosure. The semiconductor device structure 800 comprises a gate structure 820 and source and drain extension regions 874 in alignment with the gate structure 820, wherein the gate structure 820 is formed on a surface of a semiconductor substrate 810. The source and drain extension regions 874 are formed adjacent to the gate structure 820 at each side of the gate structure 820 within the semiconductor substrate 810. Additionally or alternatively, halo regions (not illustrated) may be further provided in the semiconductor substrate 810. According to the illustrative embodiment as depicted in FIG. 8, the gate structure 820 comprises a gate insulating layer 824, a gate metal layer 825 and a gate electrode layer 826.

According to an illustrative example, the semiconductor device structure 800 as depicted in FIG. 8 may be obtained by performing an etch process to the semiconductor device structure 700 as depicted in FIG. 7 for removing the sidewall spacers 742 of FIG. 7. The person skilled in the art will appreciate that the sidewall spacer structure 742 as depicted in FIG. 7 may represent a dummy spacer structure.

Figure 9:
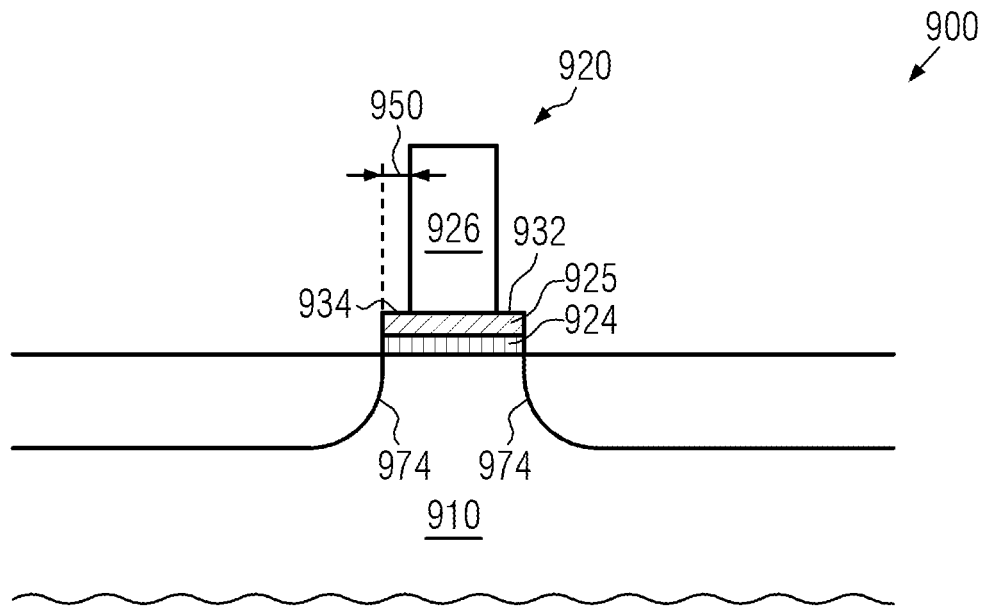

FIG. 9 shows a semiconductor device structure 900 having a gate structure 920 disposed on a surface of a semiconductor substrate 910. The gate structure 920 comprises a gate insulating layer 924 and a gate metal layer 925 disposed on the gate insulating layer 924. Over the gate insulating layer 924 and the gate metal layer 925, a trimmed gate electrode layer 926 is formed. The gate structure 920 may be formed in correspondence with illustrative embodiments as described with regard to gate structure 220 as shown in FIG. 2.

The trimmed gate electrode layer 926 of the trimmed gate structure 920 overlies the gate metal layer 925 such that exposed surfaces 932 and 934 of the gate metal layer 925 are not covered by the gate electrode layer 926. The person skilled in the art will appreciate that the exposed surfaces 932 and 934 define protruding portions of the gate metal layer 925 and the gate insulating layer 924 projecting away from the trimmed gate electrode layer 926 by a distance represented by reference numeral 950 in FIG. 9. Source and drain extension regions 974 are formed in the semiconductor substrate 910 in alignment with the gate metal layer 925 and the gate insulating layer 924. The person skilled in the art will appreciate that the gate structure 920 of the semiconductor device structure 900 as depicted in FIG. 9 has a length dimension which is basically decoupled from the position of the source and drain extension regions 974 defining a channel length of a channel region extending under the gate structure 920 in the semiconductor substrate 910.

Figure 10:
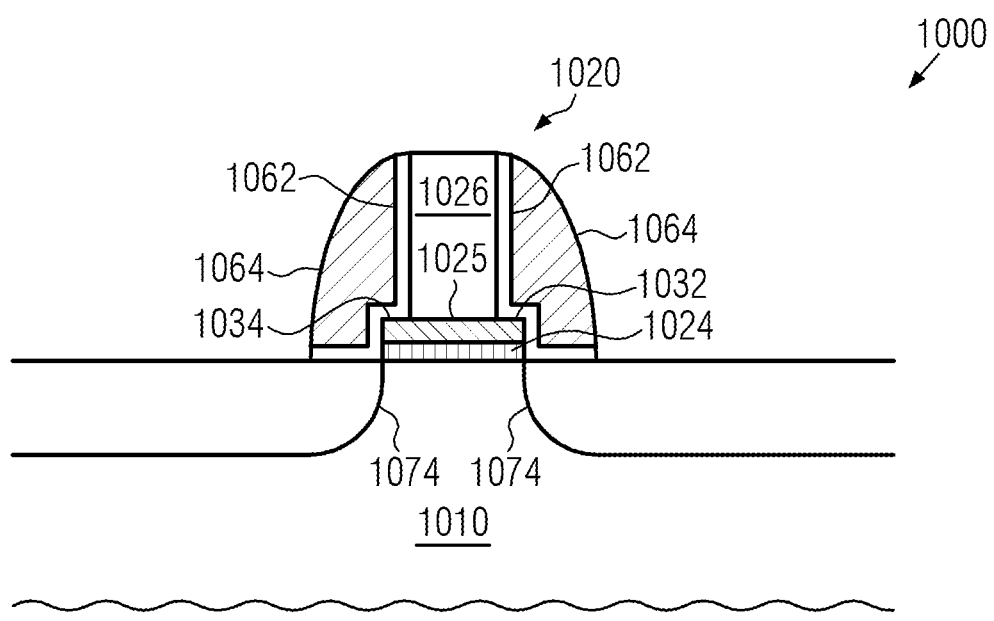

FIG. 10 shows a semiconductor device structure 1000 and a semiconductor substrate 1010 according to an illustrative embodiment of the present disclosure. The semiconductor device structure 1000 comprises a gate structure 1020 disposed on a surface of the semiconductor substrate 1010. The gate structure 1020 has a gate insulating layer 1024, a gate metal layer 1025 and a trimmed gate electrode layer 1026. Adjacent to the gate structure 1020, one or more sidewall spacers 1062 and 1064 are formed. The person skilled in the art will appreciate that although FIG. 10 explicitly illustrates an exemplary embodiment having two sidewall spacers 1062 and 1064 formed adjacent to the gate structure 1020 at each side of the gate structure 1020, only one sidewall spacer or alternatively more than two sidewall spacers may be provided.

The illustrative embodiment depicted in FIG. 10 shows a liner spacer 1062 being formed adjacent to the trimmed gate electrode layer 1026 and the layer stack of the gate insulating layer 1024 and the gate metal layer 1025 so as to cover the surfaces 1034 and 1032 of the gate metal layer 1025 that are not covered by the trimmed gate electrode layer 1026. Source and drain extension regions 1074 are formed in the semiconductor substrate 1010 in alignment with the gate insulating layer 1024 and the gate metal layer 1025. The sidewall spacers 1062 and 1064 are formed over the source and drain extension regions 1074 such that portions of the sidewall spacers 1062 and 1064 are disposed on the source and drain extension regions 1074 so as to partially cover the source and drain extension regions 1074. According to an illustrative example, the liner spacer 1062 may have a substantially deformed "W" shape as depicted in FIG. 10. According to some illustrative embodiments, a thickness of the liner spacer 1062 may be in a range of about 1-10 nm or in a range of about 2-5 nm.

According to an illustrative example, the semiconductor device structure 1000 may be obtained subsequent to forming the gate structure 920 of FIG. 9 by forming one or more sidewall spacers adjacent to the gate structure 920 of FIG. 9. The person skilled in the art will appreciate that forming one or more sidewall spacers may comprise forming a spacer by depositing a spacer-forming material having a thickness corresponding to the distance 950 in FIG. 9 depicting gate electrode material of the gate electrode layer which was removed when performing the trimming process for forming the trimmed gate electrode layer 926 which is depicted in FIG. 9. Alternatively, a thickness of a deposited spacer-forming material may be greater than the distance 950 of FIG. 9.

Figure 11:
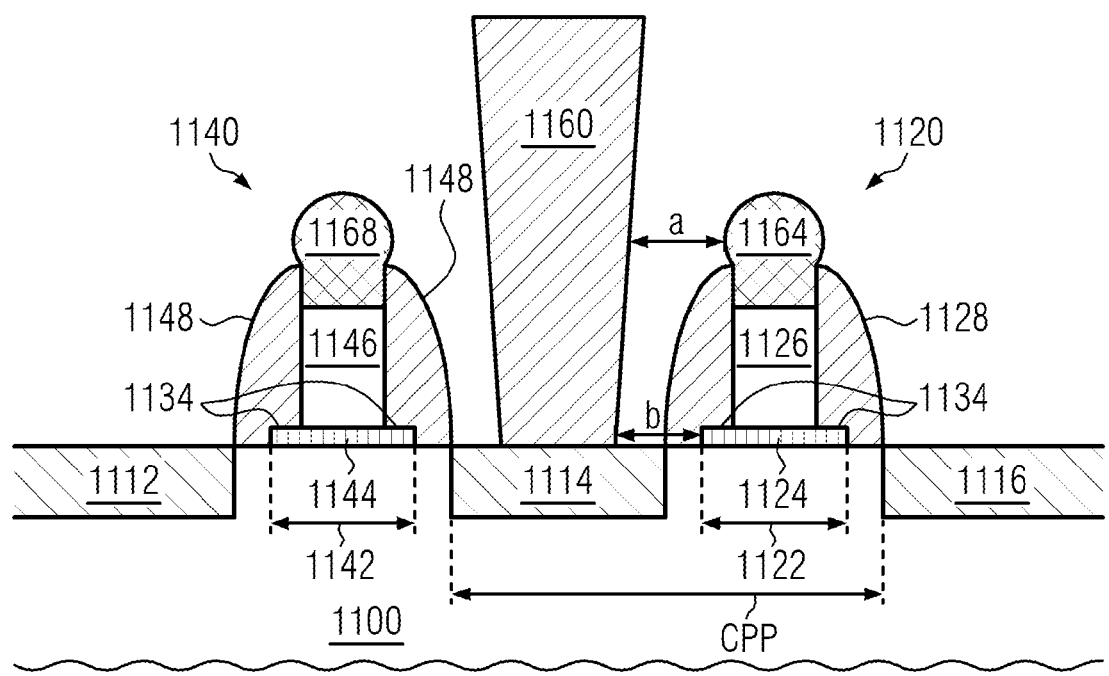
FIG. 11 schematically illustrates, in a cross-sectional view, a semiconductor device structure according to some illustrative embodiments of the present disclosure.

FIG. 11 shows a semiconductor device structure during middle-end-of-line (MEOL) fabrication process flow according to some illustrative embodiments of the present disclosure.

FIG. 11 shows a semiconductor substrate 1100 and two gate structures 1120 and 1140 disposed on a surface of the semiconductor substrate 1100. Source/drain regions 1112, 1114 and 1116 are formed within the semiconductor substrate 1100 adjacent to each of the gate structures 1120, 1140 without explicitly depicting source and drain extension regions and optional halo regions. The gate structure 1120 has a gate insulating layer 1124, a trimmed gate electrode layer 1126 and a gate silicide 1164 formed on the trimmed gate electrode layer 1126. Although for ease of illustration only the gate insulating layer 1124 is explicitly depicted, no limitation of the present disclosure is intended. It is noted that the depicted layer 1124 may be comprised of a gate insulating layer and a gate metal layer formed on the gate insulating layer in accordance with the preceding description. Sidewall spacers 1128 are formed at each side of the gate structure 1120 such that surfaces 1134 of the layer 1124 are covered by the sidewall spacers 1128 which surfaces 1134 are not covered by the trimmed gate electrode layer 1126.

Accordingly, the gate structure 1140 has a gate insulating layer 1144, a trimmed gate electrode layer 1146 and a gate silicide 1168 formed on the trimmed gate electrode layer 1146. Although for ease of illustration only the gate insulating layer 1144 is explicitly depicted, no limitation of the present disclosure is intended. It is noted that the depicted layer 1144 may be comprised of a gate insulating layer and a gate metal layer formed on the gate insulating layer in accordance with the preceding description. Sidewall spacers 1148 are formed at each side of the trimmed gate structure 1140 such that surfaces 1134 of the layer 1144 are covered by the sidewall spacers 1148 which surfaces 1134 are not covered by the trimmed gate electrode layer 1146.

A length of the gate insulating layer 1124 is represented by an arrow 1122, while a length of the gate insulating layer 1144 is represented by an arrow 1142. The person skilled in the art will appreciate that arrows 1124 and 1142, respectively, represent length dimensions of channels extending under the respective gate structures 1120 and 1140. It is noted that, by means of gate structures 1120, 1140, semiconductor devices may be provided having gate electrode layers 1126, 1146 with length dimensions that are decoupled from the respective channel lengths 1122, 1142. A contact 1160 schematically represents a contact for contacting the source and drain of a transistor structure comprising one of the gate electrode structures 1120, 1140. The contact 1160 is disposed on the source or drain region 1114. According to the illustration in FIG. 11, a CPP is schematically depicted as a pitch between the source and drain regions 1114 and 1116.

The contact geometry in accordance with the illustrative embodiment as depicted in FIG. 11 is further parameterized by two parameters, "a" and "b", wherein the parameter "b" characterizes a distance between the contact 1160 and the gate insulating layer 1124 of the trimmed gate structure 1120, and the parameter "a" characterizes a distance between the contact 1160 and the gate silicide 1164 of the gate structure 1120. Due to the trimmed gate electrode layer 1126 of the gate structure 1120, the parameter "a" is expected to be greater or equal to the parameter "b" for a given CPP. The person skilled in the art will appreciate that the parameter "a" may be increased relative to the prior art parameter "a" in FIG. 1 without affecting the source/drain contact 1160 and, in particular, without affecting the contact resistance of the contact 1160.

Figure 12:
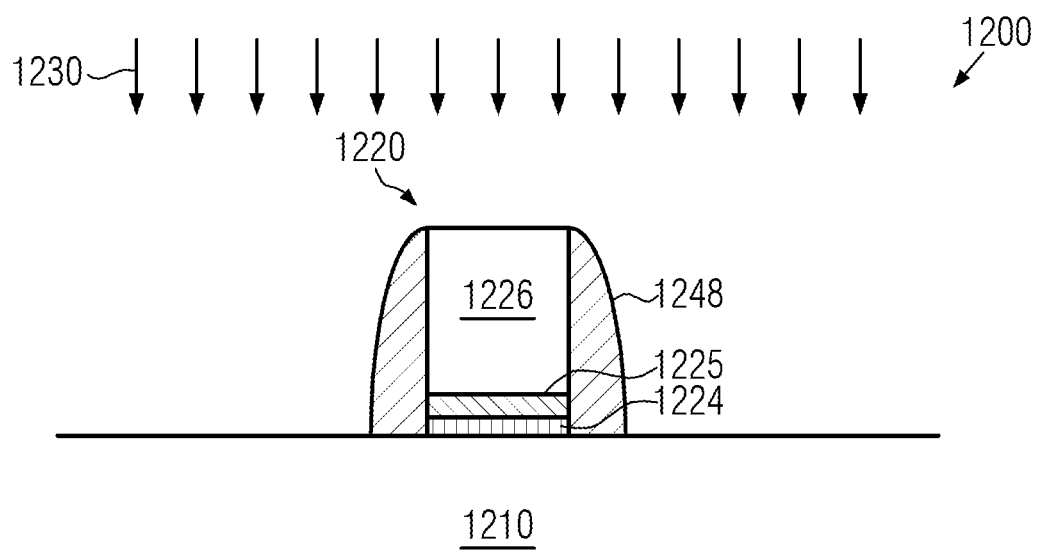
FIGS. 12-13 schematically illustrate, in cross-sectional views, still further illustrative embodiments of the present disclosure.

With regard to FIGS. 12 and 13, some alternative embodiments of the present disclosure will be described. FIG. 12 shows a semiconductor device structure 1200 and a semiconductor substrate 1210. The semiconductor device structure 1200 has a gate structure 1220 formed on a surface of the semiconductor substrate 1210. The gate structure 1220 comprises a gate insulating layer 1224, a gate metal layer 1225 and a gate electrode layer 1226. Adjacent to the gate structure 1220, a sidewall spacer structure 1248 is formed at each side of the gate structure 1220.

The person skilled in the art will appreciate that the semiconductor device structure 1200 as depicted in FIG. 12 may correspond to a configuration which is explained with regard to FIG. 6 above. It is further noted that the semiconductor device structure 1200 may alternatively correspond to the semiconductor device structure 700 as described with regard to FIG. 7, although FIG. 12 does not explicitly illustrate source and drain extension regions.

Figure 13:
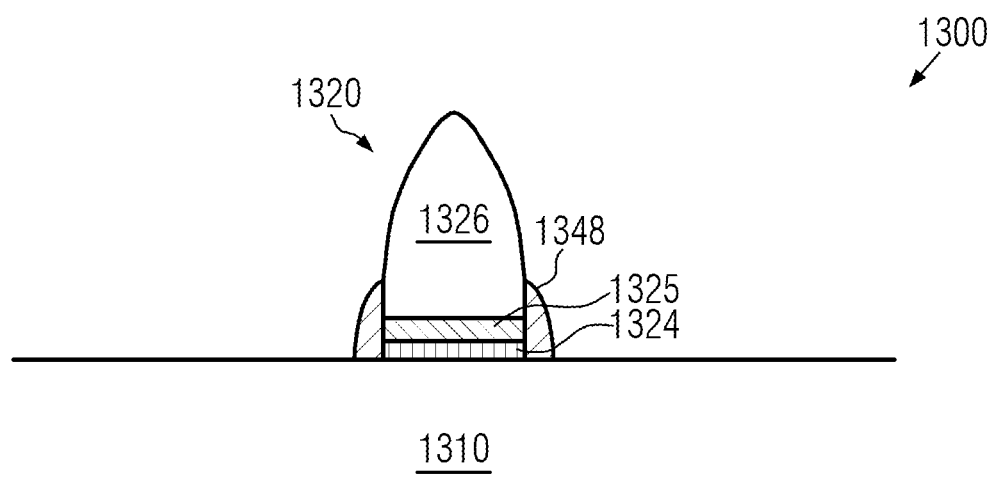

Next, a trimming process 1230 may be applied to the semiconductor device structure 1200 in order to provide the semiconductor device structure 1300 as depicted in FIG. 13. When applying the trimming process 1230, a trimmed gate structure 1320 is formed. As illustrated in FIG. 13, the trimmed electrode structure 1320 is disposed on a surface of a semiconductor substrate 1310. The trimmed gate structure 1320 comprises a gate insulating layer 1324, a gate metal layer 1325 and a trimmed gate electrode layer 1326. At each side of the trimmed gate structure 1320, a trimmed sidewall spacer structure 1348 is formed.

The trimming process (1230 in FIG. 12) may be configured such that the top part of the trimmed gate electrode layer 1326 assumes a shape of a rounded tip. The person skilled in the art will appreciate that, due to the trimming process (1230 in FIG. 12), a space for contacts to land during subsequent processing between two adjacent gate structures may be increased.

According to some illustrative embodiments herein, the etch process may comprise shaping the top part of polysilicon, wherein the gate insulating layer 1324 and the gate metal layer 1325 are protected by spacer material. According to a special example herein, it is possible to incorporate anisotropic physical etch components like Ar-ions which are accelerated to the wafer surface and then physically removing polysilicon at its top portion by momentum transfer from Ar-ions to polysilicon atoms.

As depicted in FIG. 13, the trimming process (1230 in FIG. 12) may not only affect the trimmed gate electrode layer 1326, but may also affect the trimmed sidewall spacer structure 1348 such that at least one sidewall spacer may be etched back. When etching back one or more sidewall spacers, a top portion of the gate electrode layer 1326 may be exposed such that the top portion of the gate electrode layer 1326 may be as well trimmed back with further trimming. According to an illustrative embodiment, a gate electrode layer with a rounded tip portion may be obtained instead of a more or less flattened top portion as in the prior art.

The person skilled in the art will appreciate that the alternative illustrative embodiments as described with regard to FIGS. 12 and 13 may result in an increased distance between an upper portion of a gate structure (for example an upper portion of the gate structure 1320 in FIG. 13) and a source/drain contact (corresponding to 1160 in FIG. 11) such that a respective parameter "a" may be increased while substantially maintaining a parameter "b" such that a relation such as "a" greater than or equal to "b" may be obtained in a contact geometry according to these alternative embodiments.

The person skilled in the art will appreciate that overall boundary conditions for reducing a length dimension, i.e., a length, of a gate electrode layer may be obtained in various illustrative embodiments of the present disclosure such that the reduced length of the gate electrode layer may still remain big enough so that contacts can land on silicide portions formed on gate electrode layers without decreasing contact CDs and negatively affecting contact resistances.

The person skilled in the art will appreciate that the application of the present disclosure may result in an increased margin for contacts to land which may be a huge benefit contributing to existing technology nodes at 32 nm and 28 nm.

The present disclosure provides methods for forming a semiconductor device. In some illustrative embodiments, a gate structure is formed, the gate structure comprising a gate insulating layer and a gate electrode structure formed on the gate insulating layer. The methods provide reducing a dimension of the gate electrode structure relative to the gate insulating layer along a direction extending in parallel to a direction connecting source and drain. The present disclosure further provides a semiconductor device structure with a gate structure. The gate structure comprises a gate insulating layer and a gate electrode structure formed above the gate insulating layer, wherein a dimension of the gate electrode structure extending along a direction which is substantially parallel to a direction being oriented from source to drain is reduced relative to a dimension of the gate insulating layer along the direction. According to some illustrative examples, gate structures are provided having a gate silicon length which is decoupled from the channel width induced by the gate structure. According to some illustrative embodiments, a spacer structure may be disposed on an upper surface portion of the gate insulating layer, the upper surface portion being substantially parallel to a surface of the semiconductor substrate which is covered by the gate structure. According to other illustrative embodiments, the gate electrode structure may have a rounded tip portion.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device, comprising:
   providing an active region in a semiconductor substrate;
   forming a gate structure in said active region, said gate structure comprising a gate insulating layer and a gate electrode structure, said gate electrode structure comprising a gate metal layer and a gate electrode layer formed above said gate metal layer;
   applying a trimming process to said gate electrode structure for removing material having a first sidewall thickness from said gate electrode structure, wherein, after applying said trimming process, a length of at least a portion of said gate electrode layer of said trimmed gate electrode structure in a gate length direction is less than a length of at least said gate metal layer in said gate length direction; and
   forming a spacer structure on the trimmed gate structure, said spacer structure having at least a second sidewall thickness that is not less than said first sidewall thickness.

2. The method of claim 1, further comprising applying a silicidation process after forming said spacer structure.

3. The method of claim 1, said trimming process comprising performing an isotropic etch process to said gate electrode structure for exposing an upper surface portion of at least one of said gate insulating layer and said gate metal layer.

4. The method of claim 1, further comprising defining doped regions in said semiconductor substrate, said doped regions being aligned with regard to said spacer structure.

5. The method of claim 1, said gate insulating layer comprising a high-k material.

6. The method of claim 1, further comprising, prior to applying said trimming process, forming a dummy sidewall spacer structure adjacent to sidewalls of said gate structure.

7. The method of claim 1, wherein forming said gate structure comprises forming a dummy spacer structure adjacent said gate structure, performing one or more implantation sequences for forming at least one of source/drain regions, source/drain extension regions and halo regions.

8. The method of claim 7, further comprising removing said dummy spacer structure before applying said trimming process.

9. The method of claim 1, wherein, prior to applying said trimming process, a sidewall of said gate electrode structure is substantially aligned with a sidewall of said gate insulating layer.

10. The method of claim 9, wherein, after applying said trimming process, at least a portion of said sidewall of said gate electrode structure is laterally offset inward from said sidewall of said gate insulating layer.

11. A method for forming a semiconductor device, comprising:
   forming a gate structure in an active region of a semiconductor substrate, said gate structure comprising a high-k gate insulating layer, a gate metal layer and a polysilicon material;
   after forming said gate structure, reducing a length of at least said polysilicon material in a gate length direction to expose an upper surface portion of at least one of said high-k gate insulating layer and said gate metal layer; and
   forming a spacer structure on said gate structure, said spacer structure covering said exposed upper surface portion.

12. The method of claim 11, further comprising forming a silicided gate region in said polysilicon material, said silicided gate region being aligned with regard to said spacer structure.

13. The method of claim 11, wherein exposing an upper surface portion comprises performing an isotropic silicon etch process with high selectivity of silicon to at least one of said high-k gate insulating material and said gate metal layer.

14. The method of claim 11, further comprising, prior to exposing said upper surface portion, forming a dummy sidewall spacer structure adjacent to sidewalls of said gate structure.

15. The method of claim 11, wherein, after exposing said upper surface portion of said at least one of said high-k gate insulating layer and said gate metal layer, said reduced length of said at least said polysilicon material in said gate length direction is less than a length of at least one of said high-k gate insulating layer and said gate metal layer in said gate length direction.

16. The method of claim 11, wherein, prior to exposing said upper surface portion, a sidewall of said polysilicon material is substantially aligned with at least one of a sidewall of said high-k gate insulating layer and a sidewall of said gate metal layer.

17. The method of claim 16, wherein, after exposing said upper surface portion, said sidewall of said polysilicon material is laterally offset inward from at least one of said sidewall of said gate insulating layer and said sidewall of said gate metal layer.

18. A method for forming a semiconductor device, comprising:
   patterning a gate electrode stack in an active region of a semiconducting device so as to form a gate electrode structure, said gate electrode stack comprising a gate insulating layer and a gate metal layer disposed on said gate insulating layer;
   etching back said gate electrode structure so as to form an etched-back gate electrode structure, wherein forming said etched-back gate electrode structure comprises reducing a gate length dimension of an upper portion of said gate electrode structure while substantially maintaining a gate length dimension of at least one of said gate insulating layer and said gate metal layer; and
   forming a spacer structure in contact with said etched-back gate electrode structure.

19. The method of claim 18, wherein at least a portion of said spacer structure replaces material removed from said gate electrode structure when etching back said gate electrode structure.

20. The method of claim 18, wherein an upper surface portion of at least one of said gate insulating layer and said gate metal layer is exposed when etching back and said spacer structure is formed so as to cover said exposed upper surface.

21. The method of claim 18, wherein, after forming said etched-back gate electrode structure, said reduced gate length dimension of said upper portion of said gate electrode structure is less than said gate length dimension of said at least one of said gate insulating layer and said gate metal layer.

22. The method of claim 18, wherein said gate electrode stack comprises a gate electrode material formed above said gate metal layer, and wherein, prior to etching back said gate electrode structure, a sidewall of said gate electrode material is substantially aligned with at least one of a sidewall of said gate insulating layer and a sidewall of said gate metal layer.

23. The method of claim 22, wherein, after etching back said gate electrode structure, said sidewall of said gate electrode material is laterally offset inward from at least one of said sidewall of said gate insulating layer and said sidewall of said gate metal layer.

24. The method of claim 22, wherein said sidewall of said gate electrode material is substantially aligned with said sidewall of each of said gate insulating layer and said gate metal layer, the method further comprising, prior to etching back said gate electrode structure, forming a dummy sidewall spacer structure adjacent to said substantially aligned sidewalls of said gate insulating layer, said gate metal layer and said gate electrode material.

* * * * *